(12) United States Patent
Confalonieri et al.

(10) Patent No.: US 7,501,974 B2
(45) Date of Patent: Mar. 10, 2009

(54) ANALOG DIGITAL CONVERTER

(75) Inventors: Pierangelo Confalonieri, Caponago (IT); Marco Zamprogno, Cesano Maderno (IT); Francesca Girardi, Milan (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/832,946

(22) Filed: Aug. 2, 2007

(65) Prior Publication Data

US 2008/0036641 A1    Feb. 14, 2008

(30) Foreign Application Priority Data

Aug. 4, 2006    (EP)    ................................. 06425570

(51) Int. Cl.
*H03M 1/12* (2006.01)
(52) U.S. Cl. ........................................ 341/172; 341/155
(58) Field of Classification Search ................ 341/172, 341/155, 120, 118, 150
See application file for complete search history.

(56) References Cited

U.S. PATENT DOCUMENTS

| | | | | |
|---|---|---|---|---|
| 4,857,930 | A | * | 8/1989 | Lucas ........................ 341/150 |
| 5,684,487 | A | * | 11/1997 | Timko ........................ 341/172 |
| 6,600,437 | B1 | | 7/2003 | Confalonieri et al. ....... 341/150 |
| 6,720,903 | B2 | | 4/2004 | Confalonieri et al. ....... 341/172 |
| 2004/0227652 | A1 | | 11/2004 | Draxelmayr ................ 341/120 |

FOREIGN PATENT DOCUMENTS

WO    96/25798    8/1996

* cited by examiner

*Primary Examiner*—Rexford Barnie
*Assistant Examiner*—Joseph Lauture
(74) *Attorney, Agent, or Firm*—Lisa K. Jorgenson; Allen, Dyer, Doppelt, Milbrath & Gilchrist, P.A.

(57) ABSTRACT

An analog/digital converter for converting an analog signal to a digital output code includes a local digital analog converter including a segmented array. The segmented array includes upper and lower segments of conversion elements selectively operable by respective digital command codes for respectively varying, according to binary weighted contributions, the voltages of first and second common nodes and the voltage of a second common node. A logic unit generates the digital command codes for controlling the local digital/analog converter according to a successive approximation technique for producing the digital output code. The converter includes a redistributor for modifying the command codes for redistributing the modified command codes between the lower segment and the upper segment, while making use of at least one auxiliary conversion element provided in the upper segment.

25 Claims, 4 Drawing Sheets

ANALOG DIGITAL CONVERTER

FIELD OF THE INVENTION

The present invention relates to the conversion of analog signals into digital signals, and in particular, to an analog/digital converter.

BACKGROUND OF THE INVENTION

In some analog/digital converters, an input signal is converted into a digital output code by a successive approximation technique. The converters operating on the basis of this technique are known as SAR converters (Successive Approximation Register). In the converters, a plurality of digital/analog conversion elements are provided which is suitably binary weighted and controlled by control logic. The digital/analog conversion elements are, for example, capacitor elements, resistor elements or current generators, generally with a terminal connected to a common node, or summing node connected to the input of a comparator by an operational amplifier, for example.

An example prior art converter is shown in FIG. 1, where in particular the basic layout of a SAR differential converter 1 with charge redistribution or capacitor arrays is illustrated. The plurality of digital/analog conversion elements, which together represent a local digital/analog converter 2, is arranged in one or more arrays (in the embodiment two arrays $AR_P$ and $AR_M$ are provided) with capacitance $C_0, \ldots, C_{N-1}$ reciprocally binary-weighted according to powers of a unit capacitance, as indicated in the figure with the value C.

Furthermore, each of the two arrays $AR_P$ and $AR_M$ comprises a capacitance $C_x$, usually indicated with the term closing capacitance, and switching means or a switch $S_x, \ldots, S_{N-1}$ associated with the capacitances and controlled by binary signals output from a logic unit 3. The logic unit 3 is also known as a successive approximation register. The capacitance of each of the two arrays $AR_p$ and $AR_M$ has electrodes respectively connected to a first $NS_P$ and a second $NS_M$ common node, connected to respective inputs of a comparator 4.

The operation of the converter 1 is well known to those skilled in the art, and therefore, will not be further explained. In a first step in the converter 1, the differential analog input signal $V_{INP}-V_{INM}$ is sampled using the arrays $AR_P$ and $AR_M$ of the capacitor elements. The capacitor elements are then used in the successive step to perform various attempts according to the logic of successive approximation. The sampled signal is compared to a reference voltage signal $\Delta V_{REF}=V_{REFP}-V_{REFM}$. The search strategy by successive approximation is carried out by the logic unit 3 on the basis of the binary signal $CMP_{out}$ output from the comparator 4. At the end of the search process, the logic unit outputs a digital code $D_{out}$ resulting from the digital conversion of a sample of the differential analog input signal $V_{INP}-V_{INM}$.

A known design technique of converters using arrays of digital/analog conversion elements provides for the division of the arrays of digital/analog conversion elements into at least two array segments separated from each other by a serial capacitance. This includes a lower array segment and an upper array segment. Each segment comprises conversion elements weighted independently from those in the other segment. In the case of division of an array into two segments, the first segment is associated with the least significant bits (LSB) of the input digital code supplied by the logic unit. The second segment is associated with the most significant bits (MSB) of the input digital code.

The division makes it possible to optimize converter operation, facilitating control of the part performing the successive approximation search, and further enabling better utilization of the area effectively occupied by the array of conversion elements. In regards to these aspects, the existing SAR converters with a resolution greater than 6 or 7 bits have this type of topology. However, division into segments causes some problems, as illustrated below, related to control of the conversion element arrays. The problems are essentially of two types. They may arise jointly or separately, and they will be explained below without any particular order of importance.

The first type of problem will be described with reference to FIG. 2, where a converter 1 is schematically shown including arrays $AR_P$, $AR_M$ of conversion elements divided into several segments. The converter is a particular embodiment of a 6 bits analog/digital converter produced according to the described in U.S. Pat. No. 6,600,437. As shown in FIG. 2, the analog/digital converter 1 comprises a digital/analog subconverter 2 including a first array $AR_P$, and a second array $AR_M$ of conversion elements in the form of a capacitor to which respective switching elements are associated.

Each of the two arrays $AR_P$, $AR_M$ is divided into two conversion element segments by respective serial capacitance. The first array $AR_P$ is divided into a lower segment $AR_{LP}$ with 3 bits, and into an upper segment $AR_{UP}$ with 3 bits. The second array $AR_M$ is divided into a lower segment $AR_{LM}$ with 3 bits, and an upper segment $AR_{UM}$ also with 3 bits. In the embodiment, both the lower segments $AR_{LP}$ and $AR_{LM}$ are provided with a closing capacitance of unitary value.

The capacitances of the lower segment $AR_{LP}$ of the first array $AR_P$ have an electrode connected to a common node $NS_{LP}$, while those of the upper segment $AR_{UP}$ of the first array have an electrode connected to a common node $NS_{UP}$. Similarly, in the second array $AR_M$, the capacitances of the lower segment $AR_{LM}$ have an electrode connected to the common node $NS_{LM}$ while the capacitances of the upper segment $AR_{UM}$ have an electrode connected to the common node $NS_{UM}$. All the above-mentioned common nodes $NS_{LP}$, $NS_{UP}$, $NS_{LM}$, $NS_{UM}$ represent summing nodes, since a sum of the analog signals is made at the nodes during operation of the converter 1.

During operation, in the input signal sampling step, the switches $SW_{SAMP}$ are closed and the summing nodes $NS_{LP}$, $NS_{UP}$, $NS_{LM}$, $NS_{UM}$ are forced to the common mode voltage $V_{CMCOMP}$ imposed by the topology of the comparator 4. After the step, the switches $SW_{SAMP}$, which are typically formed by transmission gates, are opened and consequently the summing nodes $NS_{LP}$, $NS_{UP}$, $NS_{LM}$, $NS_{UM}$ remain floating. The subsequent switching of the capacitances of the arrays may need to be such that the potential of the summing nodes does not rise above the direct input voltage $V_{DD}$ of the converter and does not go below the ground voltage $V_{GND}$.

If, on the contrary, one of the above-mentioned conditions takes place, the junctions would be biased directly towards the substrate of the switches $SW_{SAMP}$. The result would be a loss current which would modify the charge stored in the capacitor arrays and compromise the accuracy of the conversion. This type of problem, also known as the dynamic range of summing nodes, afflicts converters with arrays of capacitance conversion elements divided into segments. In particular, this regards the summing nodes of the lower segments of the arrays of conversion elements. Potentially, the problem could also affect the summing nodes $NS_{UP}$, $NS_{UM}$ of the upper segments $AR_{UP}$, $AR_{UM}$. But due to the development of the successive approximations, the problem has a much smaller or negligible effect on these nodes.

In another example, the problem of the dynamic range of the summing nodes is also present in a converter operating according to the method described in U.S. Pat. No. 6,720,903. The object of the patent is to offer an effective circuit approach to the problem of signal sampling with variable dynamic range in conversion structures comprising capacitor arrays. The technique makes it possible to control, with a discretization of 1 LSB, sampling of input signals with a dynamic range greater than or equal to the voltage reference value.

According to the method provided for in the above-mentioned U.S. patent, the input signal to be sampled is charged on a suitable fraction of the capacitor arrays. This includes charging the common mode voltage $V_{CM}$ on the remaining part where the signal to be converted is developed. In this way, it is possible to carry out scaling of the input signal without the presence of any external scaling circuit. Therefore, advantages in terms of a reduction in area and consumption are provided. However, it has been noted that a problem which can arise in a converter operating according to the above-mentioned U.S. patent concerns the possibility that, during the initial step of charging the input signal to be converted, the voltage of the summing nodes of the lower segments of the arrays reaches values outside the permitted dynamic range. Furthermore, after the initial sampling step, the problem of the dynamic range of the summing nodes can reappear during the various attempts at successive approximation. This happens in the converter illustrated in FIG. 2, for example.

A second type of problem related to the presence of arrays of conversion elements divided into segments arises when it is necessary to add an analog signal, such as an offset to the signal to be converted. To satisfy the requirement, the prior art uses auxiliary arrays, as in the differential analog/digital converter 1 schematically shown in FIG. 3. To sum an offset to the input signal to be converted, the illustrated converter which is identical to the converter shown in FIG. 2 is provided with two auxiliary arrays $AUX_P$ and $AUX_M$ scaled so as to control offset contributions of up to 4 LSB with discretization of a quarter of LSB.

During operation, in the input signal sampling step, the capacitances of the auxiliary arrays are connected to $V_{CM}$ and the summing nodes $NS_{AP}$, $NS_{AM}$ of the auxiliary arrays $AUX_P$ and $AUX_M$ are forced to $V_{CMCOMP}$, in the same way as the summing nodes of the two arrays $AR_P$ and $AR_M$. Immediately after the sampling instant, the capacitances of one of the two auxiliary arrays $AUX_P$ and $AUX_M$ switch to $V_{REFP}$ or to $V_{REFM}$, and those of the other auxiliary array switch dually to $V_{REFM}$ or to $V_{REFP}$ to introduce the desired offset.

According to another prior art approach, the auxiliary arrays $AUX_P$ and $AUX_M$ can be used, during an initial step to carry out a SAR conversion method intended to determine the voltage offset value of the converter, and subsequently to compensate the predetermined offset. Within the limits of the converter resolution, the offset can be cancelled with an accuracy determined by the scale of the auxiliary arrays $AUX_P$ and $AUX_M$. Auxiliary arrays are used not only when it is necessary to sum an offset to the input signal, but also more generally, when it is necessary to sum an analog signal to the signal to be converted. For example, in the case where a dither needs to be introduced into the input signal, as is normal in the above-sampled converters (or sigma-delta converters).

The use of auxiliary arrays requires a significant increase in area occupation. Moreover, it should be considered that the auxiliary arrays $AUX_P$ and $AUX_M$ introduce further summing nodes $NS_{AP}$, $NS_{AM}$. For this reason, the design and layout of the local digital/analog converter 2 is particularly complex, especially if the first type of problem described above, i.e., the dynamic range of the summing nodes, is to be avoided.

SUMMARY OF THE INVENTION

In view of the foregoing background, an object of the present invention is to provide an analog/digital converter comprising a local digital analog converter including arrays of conversion elements to overcome the above-mentioned problems.

This and other objects, advantages and features in accordance with the present invention are provided by an analog/digital converter comprising a local digital/analog converter comprising at least one segmented array comprising an upper segment and a lower segment of conversion elements that can be selectively enabled by respective command codes for respectively varying, according to binary weighted contributions, a voltage of a first common node and a voltage of a second common node, with the upper segment of conversion elements comprising at least one auxiliary conversion element. A logic unit may generate digital command codes for controlling the local digital/analog converter according to a successive approximation technique for producing the digital output code. A redistributor may modify the command codes generated by the logic unit for redistributing the command codes between the lower segment and the upper segment while making use of the at least one auxiliary conversion element in the upper segment.

BRIEF DESCRIPTION OF THE DRAWINGS

The invention will be better understood from the following detailed description of two exemplary but non-limiting embodiments thereof, as illustrated in the accompanying drawings, in which.

DETAILED DESCRIPTION OF THE PREFERRED EMBODIMENTS

Figure 1:
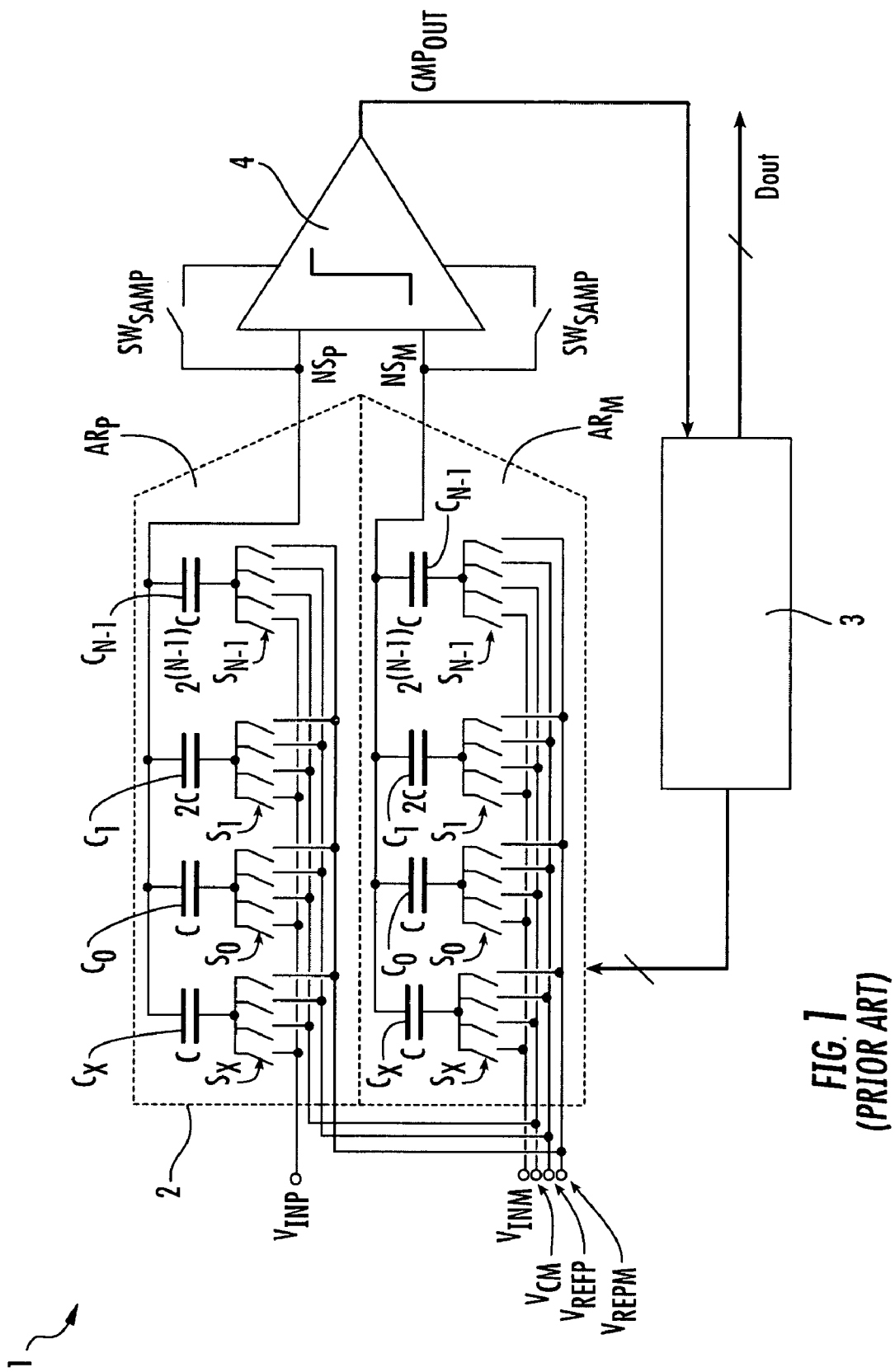
FIG. 1 schematically shows a first embodiment of a prior art analog/digital converter.
Figure 2:
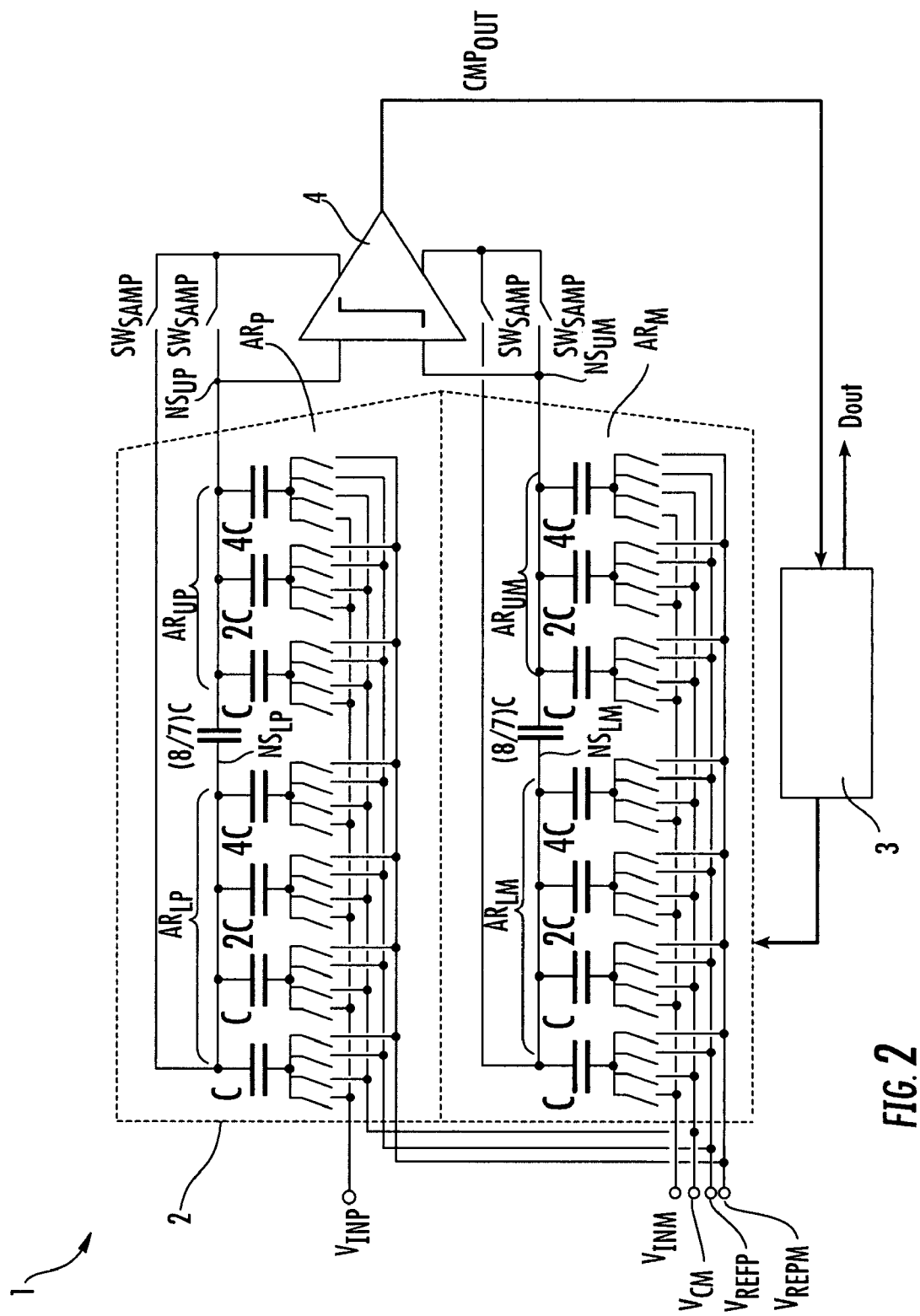
FIG. 2 schematically shows a second embodiment of a prior art analog/digital converter.
Figure 3:
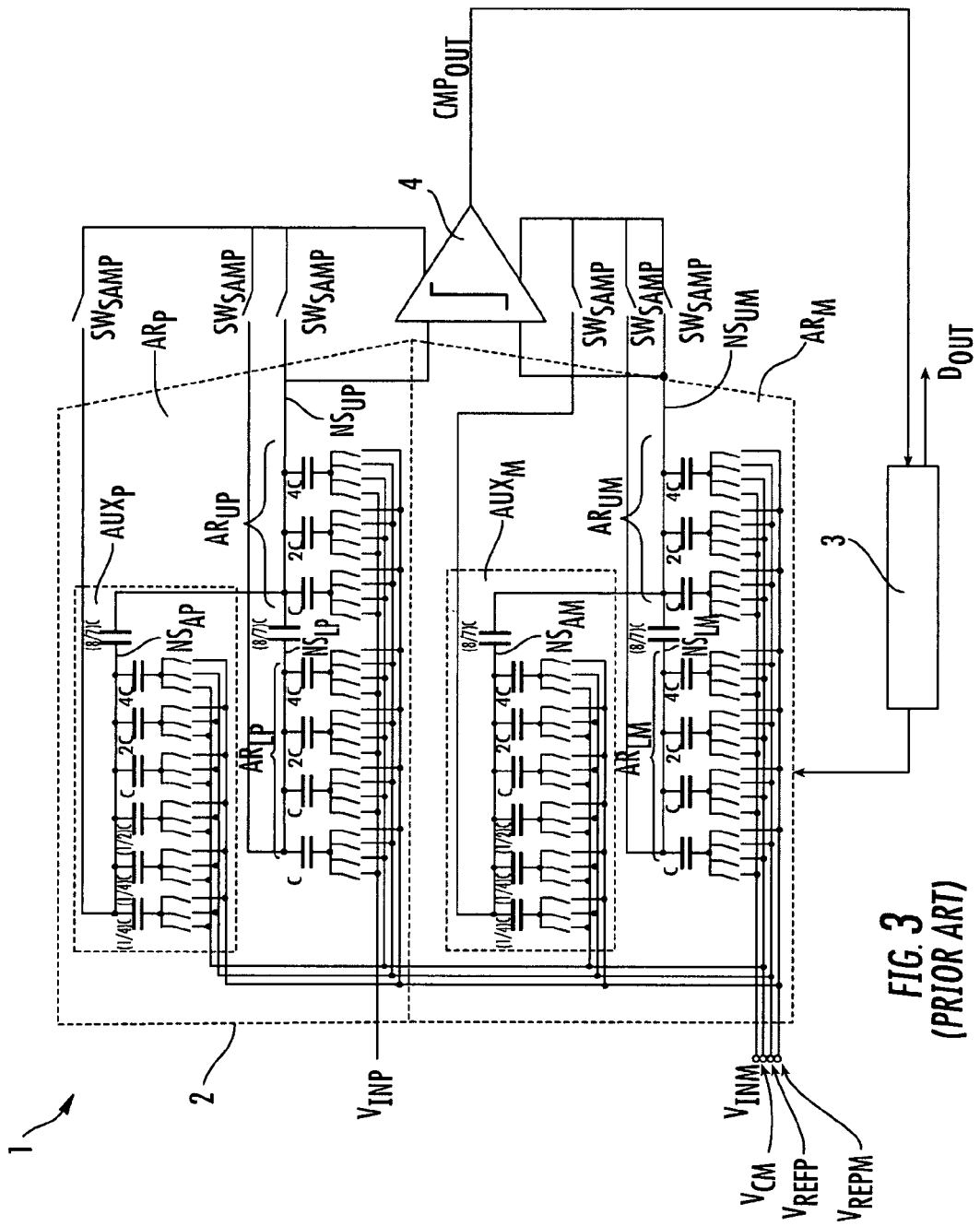
FIG. 3 schematically shows a third embodiment of a prior art analog/digital converter.
Figure 4:
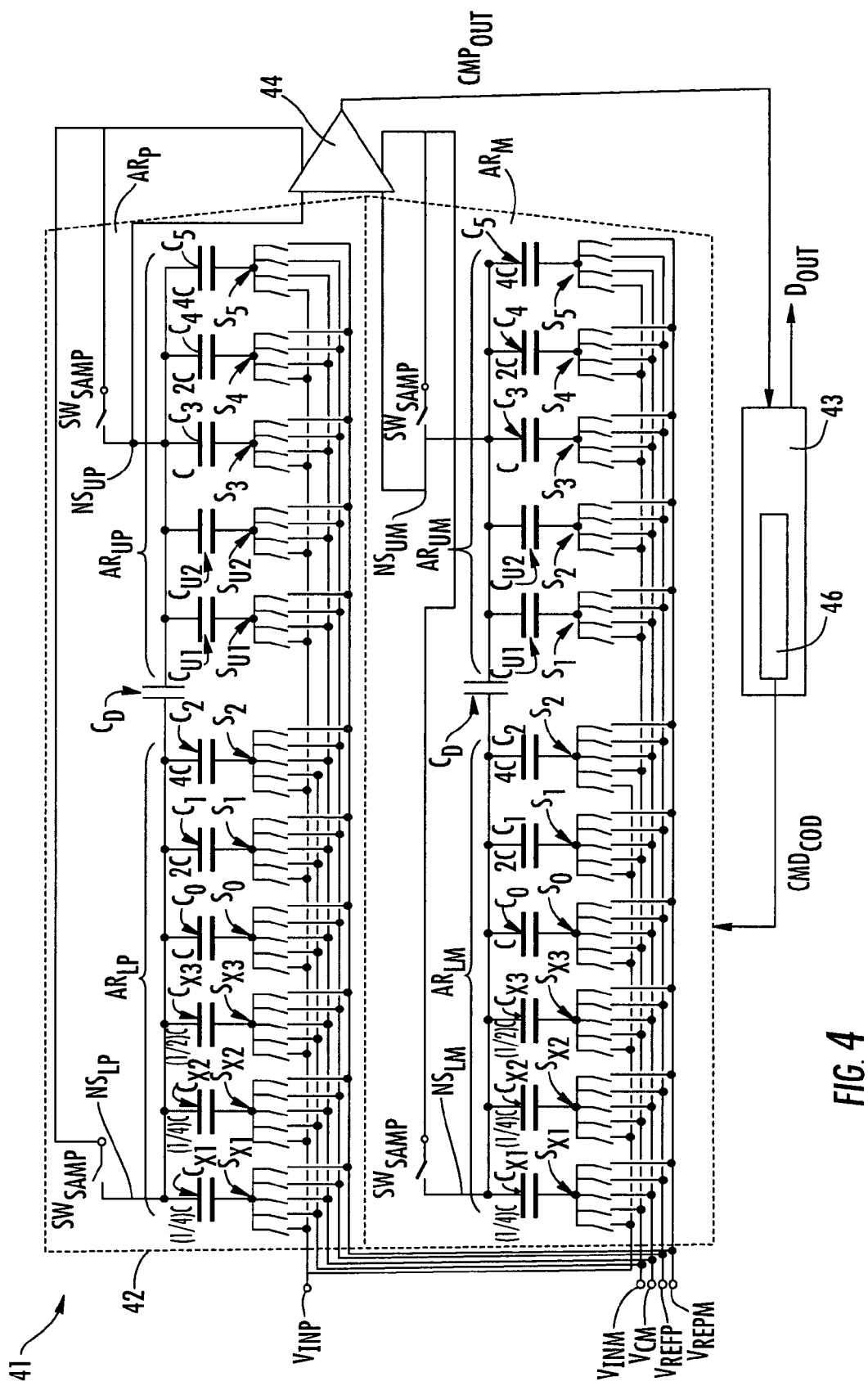
FIG. 4 schematically shows a particularly preferred embodiment of an analog/digital converter according to the present invention.

With reference to FIG. 4, a successive approximation analog/digital converter is shown, and is generally indicated with reference numeral 41. Some of the components correspond to those of FIGS. 1-3 and are indicated with the same reference numbers. The analog/digital converter 41 converts samples of an input analog signal $V_{INP}$-$V_{INM}$ into respective output digital codes $D_{OUT}$. For exemplary but non-limiting purposes, the converter 41 described is an analog/digital converter with a resolution of 6 bits. In other words, the output digital codes $D_{OUT}$ are digital codes on 6 bits for the particular embodiment illustrated.

The illustrated converter 41 is a differential analog/digital converter, i.e., an analog input signal including the two differential mode components $V_{INP}$ and $V_{INM}$ are received as inputs along with the common mode component $V_{CM}$. Since it is a differential converter, the reference voltage is also differential, and in the embodiment, is given by the two components indicated with $V_{REFM}$ and $V_{REFP}$ in the figure.

Although the particular embodiment described refers to a differential analog/digital converter, it can also be extended to single-ended or pseudo-differential type conversion structures of the type described in European Patent No. 1,405,419.

In accordance with the base drawing typical of a successive approximation converter, the analog/digital converter 41 includes a local digital analog converter 42 with a plurality of conversion elements, a comparator 44 and a logic control unit 43 to generate digital command codes $CMD_{COD}$ to control the local digital analog converter 42 according to prior art conversions based on search by successive approximations (SAR). Each bit of a command code $CMD_{COD}$ controls a respective digital analog conversion element of the local digital analog converter 42.

The local digital/analog converter 42 further includes at least one segmented array $AR_P$, $AR_M$ comprising an upper segment $AR_{UP}$, $AR_{UM}$ and a lower segment $AR_{LP}$, $AR_{LM}$ of digital/analog conversion elements $C_0$-$C_5$ which can be selectively enabled/disabled on the basis of respective bits of the command codes $D_{OUT}$ output from the logic control unit 43.

In the embodiment illustrated, since the analog/digital converter 41 is a differential type converter, the local digital/analog converter 42 includes two segmented arrays $AR_P$ and $AR_M$ of conversion elements $C_0$-$C_5$, a first segmented array $AR_P$ and a second segmented array $AR_M$ respectively. The first segmented array $AR_P$ includes a lower segment $AR_{LP}$ of conversion elements $C_0$-$C_2$ and an upper segment $AR_{UP}$ of conversion elements $C_3$-$C_5$. Similarly, the second segmented array $AR_M$ includes a lower segment $AR_{LP}$ of conversion elements $C_0$-$C_2$ and an upper segment $AR_{UP}$ of conversion elements $C_3$-$C_5$.

The conversion elements $C_0$-$C_2$ of the lower segments $AR_{LP}$ and $AR_{LM}$ are connected to a respective common node (or summing node) $NS_{LP}$, $NS_{LM}$, and can be selectively enabled by command codes $CMD_{COD}$ to vary, according to the binary weighted contributions, the voltage of the respective common node $NS_{LP}$, $NS_{LM}$. Similarly, the conversion elements $C_3$-$C_5$ of the upper segments $AR_{UP}$ and $AR_{UM}$ are connected to a respective common node (or summing node) $NS_{UP}$, $NS_{UM}$, and can be selectively enabled by the command codes $CMD_{COD}$ to vary, according to binary weighted contributions, the voltage of the respective common node $NS_{UP}$, $NS_{UM}$.

The summing nodes $NS_{LP}$, $NS_{LM}$, $NS_{UP}$ and $NS_{UM}$ are connected according to the prior art by suitable switches $SW_{SAMP}$ to the comparator 44. In fact, it should be observed that the connection of the summing nodes to the comparator 44 illustrated in FIG. 4 is the same as the prior art converter in FIG. 2.

In the analog/digital converter 41 in FIG. 4, decoupling means or a decoupler $C_D$ is provided between each lower segment $AR_{LP}$, $AR_{LM}$ and the respective upper segment $AR_{UP}$, $AR_{UM}$. In the particular embodiment in FIG. 4, the decoupling means is represented by a serial capacitance $C_D$. However, similar or equivalent decoupling means can be provided in alternative embodiments.

In the particular embodiment illustrated, the conversion elements of the arrays $AR_P$ and $AR_M$ are capacitances $C_0$-$C_5$ switched by respective groups of switches $S_0$-$S_5$ controllable by the command code $CMD_{COD}$. For this reason, the analog/digital converter 41 is defined as a successive approximation digital analog converter with charge redistribution.

The teachings herein can be extended to other types of successive approximation converters with segmented arrays of conversion elements in the form of resistors or current generators instead of switched capacitances, or in general, with segmented arrays of conversion elements selectively controllable to vary according to binary weighted contributions the voltage of the common nodes. It is also possible to provide segmented and mixed arrays of conversion elements including a lower array segment with a first type of conversion element (e.g., resistors) and an upper array segment including a second type of conversion elements (e.g., switched capacitors).

In the illustrated embodiment, the capacitances $C_0$-$C_2$ and $C_3$-$C_5$ are binary weighted according to multiples of a unit capacitance with value C. In a particularly preferred embodiment, the lower array segments $AR_{LP}$, $AR_{LM}$ include a closing capacitance, preferably divided into three capacitances $Cx_1$, $Cx_2$, $Cx_3$. The advantage of the division is that it is possible to control a greater discretization if an offset is to be added to the input signal.

The analog/digital converter 41, and in particular the local digital analog converter 42, includes at least one auxiliary conversion element $C_{U1}$, $C_{U2}$ provided in the upper segment $AR_{UP}$, $AR_{UM}$. In a particularly preferred embodiment, the logic unit 43 activates the auxiliary conversion elements $AR_{UP}$, $AR_{UM}$ to supply to the corresponding common node $NS_{UP}$, $NS_{UM}$ an increase in voltage equal to the minimum (in module) of the voltage increases which can be supplied by the conversion elements $C_3$, $C_4$, $C_5$ of the upper segment $AR_{UP}$, $AR_{UM}$ including the auxiliary conversion element.

In the illustrated embodiment in FIG. 4, the upper array segment $AR_{UP}$ includes two auxiliary conversion elements respectively $C_{U1}$, $C_{U2}$, which are two capacitances that can be switched by respective switching means $S_{U1}$, $S_{U2}$ associated with them. Preferably, each of the capacitances $C_{U1}$, $C_{U2}$ has a value equal to the unit capacitance C.

Similarly, the lower array segment $AR_{UM}$, includes two conversion elements respectively $C_{U1}$, $C_{U2}$, which are two capacitances that can be switched by respective switching means $S_{U1}$, $S_{U2}$ associated with them. Preferably, each of the capacitances $C_{U1}$, $C_{U2}$ has a value equal to the unit capacitance C.

If, for example, the upper segments $AR_{UP}$, $AR_{UM}$ include conversion elements in the form of current generators instead of capacitor elements, the at least one auxiliary conversion element would be one or more current generators which can output a current (not zero) preferably having a value equal to the minimum of the currents that can be supplied by each of the current generators included in the upper array.

As shown in FIG. 4, the analog/digital converter 41 further comprises redistribution means or a redistributor 46 so as to modify the digital command codes $CMD_{COD}$ supplied by the logic unit 43, and in particular, to redistribute the command codes between the lower segment $AR_{LP}$, $AR_{LM}$ and the upper segment $AR_{UP}$, $AR_{UM}$ using the auxiliary conversion element (or elements) $C_{U1}$, $C_{U2}$. As will be explained below, in this way it is advantageously possible to sum analog signals to the input signal without using auxiliary arrays of conversion elements.

In a particularly preferred embodiment, redistribution is carried out according to redistribution criteria to prevent the voltage of the common node $NS_{LP}$, $NS_{LM}$ of the lower segment $AR_{LP}$, $AR_{LM}$ from having a value outside from a predetermined range of voltage values. The range can be chosen by the designer at will, within certain limits, on the basis of the margin desired to avoid exceeding the permitted dynamic range of the summing nodes of the lower segment. In other words, the redistribution criteria operates in such a way that the potential of the common nodes $NS_{LP}$, $NS_{LM}$ of the lower segment $AR_{LP}$, $AR_{LM}$ do not exceed the supply voltage value $V_{DD}$ and do not go below ground value.

For example, in the particular case of the converter in FIG. 4, it is possible to assume redistribution criteria so as to: leave unchanged the command codes which determine, in the lower segment $AR_{LP}$, $AR_{LM}$, a switched capacitance equivalent at most to approximately half of the total capacitance of the conversion elements of the lower array $AR_{LP}$ (or of the lower array $AR_{LM}$); and to modify the remaining command codes, transforming them into new command codes to redistribute the total capacitance to be switched from the lower segment to the upper segment. This is performed using the auxiliary element so that the new command codes bring about, in the lower segment, a capacitance switching equivalent at most to approximately half of the total capacitance of the lower array $AR_{LP}$ (or of the lower array $AR_{LM}$).

The preferred and non-limiting embodiment of for criteria described above makes it possible to obtain the maximum safety margin on the potentials allowed at the summing nodes. Obviously, other redistribution criteria are possible but corresponding to smaller safety margins.

In the exemplary and non-limiting embodiment in FIG. 4, the redistribution means 46 is illustrated as part of the logic unit 43. Preferably, the redistribution means 46 is produced by a digital logic circuit, such as a combined logic circuit.

Two non-limiting embodiments of redistribution of command codes are given below. In a first embodiment, in the circuit in FIG. 4, it is assumed that the digital command code $CMD_{COD}$ generated by the logic unit 46 in one of the attempts (or steps) of the SAR conversion is 111010.

This is equivalent to saying that in a prior art converter the first three bits, i.e., 1,1,1, should respectively control the capacitances $C_5$, $C_4$, $C_3$ of the upper segment $AR_{UP}$, and complementarily, the capacitances $C_5$, $C_4$, $C_3$ of the lower segment $AR_{UM}$. The remaining three bits, i.e., 0,1,0, should respectively control the capacitances $C_2$, $C_1$, $C_0$ of the lower segment $AR_{LP}$, and complementarily, the capacitances $C_2$, $C_1$, $C_0$ of the lower segment $AR_{LM}$.

Assuming that an offset is to be added to the input signal, the analog offset corresponds to the digital code 000101 to carry out an offset compensation, for example. This is not the only reason why in some analog/digital converters the need is felt to add an offset, or more in general, an analog signal to the input signal.

Considering the addition of the offset, the total command code generated by the logic unit is, therefore, equal to the sum code 111111. The code would bring about switching of all the capacitances of the lower segment $AR_{LP}$ and $AR_{LM}$ and potentially causing a problem of exceeding the dynamic range of the common nodes $NS_{LP}$ and $NS_{LM}$.

By advantageously carrying out redistribution of the command code so as to make use of the presence of the auxiliary conversion elements $C_{U1}$, $C_{U2}$, it would be possible to operate in such a way that the first three bits of the command code, i.e., 1,1,1 are left unaltered and control directly the capacitances $C_5$, $C_4$, $C_3$ of the upper segment $AR_{UP}$ and $AR_{UM}$ (in the embodiment this implies that the capacitances $C_5$, $C_4$, $C_3$ of the upper segment $AR_{UP}$ switch to $V_{REFP}$ while the capacitances $C_5$, $C_4$, $C_3$ of the upper segment $AR_{UM}$ switch to $V_{REFM}$).

Regarding the remaining portion of three bits of the command code (i.e., 1,1,1), to limit the dynamic range of the summing node $NS_{LP}$, $NS_{LM}$, the code 1,1,1 is passed by controlling the auxiliary capacitance $C_{U1}$ (which switches from $V_{CM}$ to $V_{REFP}$ in the upper segment $AR_{UP}$ and from $V_{CM}$ to $V_{REFM}$ in the upper segment $AR_{UM}$) for determining at the comparator input 44 a differential contribution of +8 (i.e., the Least Significant Bits), and the capacitance $C_0$ of the lower segment $AR_{LP}$, $AR_{LM}$ (which switches from $V_{CM}$ to $V_{REFM}$ in the lower segment $AR_{LP}$ and from $V_{CM}$ to $V_{REFP}$ in the lower segment $AR_{LM}$) for determining a differential contribution of −1 at the comparator input. The remaining capacitances switch to $V_{CM}$.

The lower portion of the command code has been modified, redistributing the original code by using the presence of the auxiliary capacitance $C_{U1}$, but keeping unaltered the differential contribution introduced into the converter.

Therefore, it should be observed that, with the introduction of auxiliary capacitance units $C_{U1}$, $C_{U2}$, (a person skilled in the art can easily deduce that the number of additional capacitances to be provided and their value depends in this embodiment on the maximum offset which is to be summed), the redistribution unit 46 can carry out redistribution of the command codes (in total, summed to known offsets if necessary) in such a way as to sum an analog signal to the input signal without the need to add auxiliary arrays. Advantageously, the redistribution unit can operate reducing to half the capacitances to be switched in the lower segment $AR_{LP}$, $AR_{LM}$. This considerably limits the effect of the problem of the dynamic range of the summing nodes.

It should also be observed that the presence of auxiliary capacitance units may only involve an attenuation of the signal between the common nodes. The effect of this attenuation (for example, in terms of signals from the comparator 44) is generally quite limited, especially if several bits are encoded in the upper segment $AR_{UP}$, $AR_{UM}$. For example, if 6 bits are encoded in the upper segment, an additional capacitance $C_{U1}$ introduces an attenuation equal to 64/65. The dynamic differential between the common nodes $NS_{UP}$ and $NS_{UM}$ of the upper segment is reduced by 1.5%).

The following TABLE 1 shows a particular application example of the redistribution to the converter in FIG. 4. In the column St_Cod, the total command code of the lower segment $AR_{LP}$, $AR_{LM}$ is given, as calculated by the logic unit after the addition of offset and before redistribution. In the example, it is assumed that the code is at most equal to 15 LSB, obtained when all the capacitances $C_0$, $C_1$, $C_2$ of the lower segment $AR_{LP}$, $AR_{LM}$ need to be controlled (7 LSB) and when an addition of 8 LSB maximum is required.

In the example given in Table 1, it is assumed for simplicity that the sum can be expressed as an integer of LSB. However, consideration needs to be given that division of the closing capacitances $C_{x1}$, $C_{x2}$, $C_{x3}$ also makes it possible to carry out discretization. This is true for at least within the limits of matching, technological production and resolution of the entire analog/digital converter.

In TABLE 1, the figures in square brackets beside the binary digital codes represent LSB values corresponding to the binary codes. B*[3:0] indicates the command code portions St_cod of the lower segment $AR_{LP}$, $AR_{LM}$ as redistributed by the block 46. For example, the code B*[0] in the column relative to the lower segment $AR_{LP}$ is the command code of the capacitance $C_0$ of the lower segment $AR_{LP}$.

TABLE 1

| St_cod | | AR$_{LP}$ | | | | | | AR$_{LM}$ | | | | | |
|---|---|---|---|---|---|---|---|---|---|---|---|---|---|
| | | B*[3:0] | | C$_{U1}$ | | C$_{U2}$ | | B*[3:0] | | C$_{U1}$ | | C$_{U2}$ | |
| 0000 | [0] | 0000 | [0] | 0 | [0] | 0 | [0] | 0000 | [0] | 0 | [0] | 0 | [0] |
| 0001 | [+1] | 0001 | [+1] | 0 | [0] | 0 | [0] | 0000 | [0] | 0 | [0] | 0 | [0] |
| 0010 | [+2] | 0010 | [+2] | 0 | [0] | 0 | [0] | 0000 | [0] | 0 | [0] | 0 | [0] |
| 0011 | [+3] | 0011 | [+3] | 0 | [0] | 0 | [0] | 0000 | [0] | 0 | [0] | 0 | [0] |
| 0100 | [+4] | 0100 | [+4] | 0 | [0] | 0 | [0] | 0000 | [0] | 0 | [0] | 0 | [0] |
| 0101 | [+5] | 0000 | [0] | 1 | [+8] | 0 | [0] | 0011 | [−3] | 0 | [0] | 0 | [0] |
| 0110 | [+6] | 0000 | [0] | 1 | [+8] | 0 | [0] | 0010 | [−2] | 0 | [0] | 0 | [0] |
| 0111 | [+7] | 0000 | [0] | 1 | [+8] | 0 | [0] | 0001 | [−1] | 0 | [0] | 0 | [0] |
| 1000 | [+8] | 0000 | [0] | 1 | [+8] | 0 | [0] | 0000 | [0] | 0 | [0] | 0 | [0] |
| 1001 | [+9] | 0001 | [+1] | 1 | [+8] | 0 | [0] | 0000 | [0] | 0 | [0] | 0 | [0] |
| 1010 | [+10] | 0010 | [+2] | 1 | [+8] | 0 | [0] | 0000 | [0] | 0 | [0] | 0 | [0] |
| 1011 | [+11] | 0011 | [+3] | 1 | [+8] | 0 | [0] | 0000 | [0] | 0 | [0] | 0 | [0] |
| 1100 | [+12] | 0100 | [+4] | 1 | [+8] | 0 | [0] | 0000 | [0] | 0 | [0] | 0 | [0] |
| 1101 | [+13] | 0000 | [0] | 1 | [+8] | 1 | [+8] | 0011 | [−3] | 0 | [0] | 0 | [0] |
| 1110 | [+14] | 0000 | [0] | 1 | [+8] | 1 | [+8] | 0010 | [−2] | 0 | [0] | 0 | [0] |
| 1111 | [+15] | 0000 | [0] | 1 | [+8] | 1 | [+8] | 0011 | [−1] | 0 | [0] | 0 | [0] |

Redistribution according to the above TABLE 1 can be implemented by redistribution combinatory logic. Since this is straightforward to design for those skilled in the art, it will not be described herein in greater detail.

The dual case, where the total code St_cod to be redistributed is negative (i.e., greater than or equal to −15 LSB), can be controlled in the differential structure in FIG. 4, exchanging in the table the role of the lower segment AR$_{LP}$ with that of the lower segment AR$_{LM}$.

It should be noted that, according to the redistribution criteria implemented in TABLE 1, the redistributed command codes are such as to switch, in the lower array segments AR$_{LP}$, AR$_{LM}$, a capacitance at most equal to half of the total capacitance of the lower segments (including the closing capacitance) so as to ensure the dynamic range of the common nodes NS$_{LP}$, NS$_{LM}$ of the lower array segments.

Moreover, the above-described approach may make it possible to carry out the necessary operations to sum an analog signal to the sampled signal, occupying a much smaller area compared to the area occupied in the prior art approaches as schematically illustrated in FIG. 3. For example, the above-described approach can be advantageously used in converters where a dither is introduced on the input signal, for example in sigma-delta converters.

Furthermore, by choosing particular redistribution criteria, the above-described approach may make it possible to obtain a significant reduction in the voltage dynamic range of the common nodes.

In the prior art approach in FIG. 3, the offset sum function is implemented by an additional total capacitance of (8+8/7)C for each array to provide the sum of a signal of ±8 LSB. In the approach in FIG. 4, only 2C of additional capacitance for each array A$_{RP}$, A$_{RM}$ may make it possible to control the sum of an equal offset contribution, and at the same time, ensure greater limitation of the dynamic range of the summing nodes.

A second embodiment will now be described. In this embodiment, the problem of the dynamic range of the summing nodes will specifically be addressed, and is separated from the problem of the addition of an analog signal to the input signal. As mentioned in the background of the invention section, according to the disclosure of U.S. Pat. No. 6,720,903, it is possible to advantageously obtain a scaling of the input voltage to match the input voltage dynamic range to the FSR (Full Scale Range) of the converter.

As already mentioned, when carrying out the method described in U.S. Pat. No. 6,720,903, the problem of the dynamic range of the summing nodes can potentially arise in two different situations: during the initial step of charging the input voltage on the capacitances of the array corresponding to the 1s of the gain code (see formula (1) of the patent U.S. Pat. No. 6,720,903), charging which takes place by a suitable initial command code supplied by the logic unit SAR; and during the various SAR attempts corresponding to the successive command codes supplied by the logic unit SAR.

With reference to FIG. 4, the illustrated converter, due to the addition of a single auxiliary capacitance C$_{U1}$, is able to address the problem of the dynamic range of the summing nodes in the two above-described situations. In fact, during the initial step of input voltage charging, it is possible to provide redistribution of the initial command code so that:

a) if the initial command code is such as to determine in the lower segment an overall switching capacitance which is less than half of the overall capacitance of the lower AR$_{LP}$ (i.e., dually, even less than half of the overall capacitance of the lower segment AR$_{LM}$), the initial command code is passed unaltered to the local digital analog converter 42; otherwise b) the input voltage V$_{INP}$ is charged on the auxiliary capacitance C$_{U1}$ of the upper segment AR$_{UP}$ (therefore, in this embodiment a contribution of 8 LSB is supplied) and on a quantity of overall capacitances of the lower segment AR$_{LM}$ so as to give an equivalent contribution in LSB equal to the difference between the contribution in LSB supplied by C$_{U1}$ (in this embodiment 8 LSB), and the initial command code. In dual mode, the input voltage is charged V$_{INM}$ on the auxiliary capacitance C$_{U1}$ of the upper segment AR$_{UM}$ and on the capacitances of the lower segment AR$_{LP}$ corresponding to the controlled capacitances of the lower segment AR$_{LM}$.

It should be observed that in the situation b), redistribution of the initial command code takes place. According to situations a) or b), after initial charging of the input voltage on the capacitor arrays, during the various attempts of the successive approximation algorithm, each corresponding to a respective successive command code generated by the logic unit, it is possible to provide redistribution of each successive command code so that:

c) if the command code is such as to determine in the lower segment AR$_{LP}$ an overall switching to V$_{REFP}$ with a capacitance of less than half of the overall capacitance of the lower segment $AR_{LP}$, the command code is passed unaltered to the local digital analog converter 42; otherwise d) the voltage $V_{REFP}$ is charged on the auxiliary capacitance $C_{U1}$ of the upper segment $AR_{UP}$ (therefore, in this embodiment a contribution of 8 LSB is supplied) and on a quantity of overall capacitances of the lower segment $AR_{LM}$ such as to give an equivalent contribution in LSB equal to the difference between the contribution in LSB supplied by $C_{U1}$ (in this embodiment 8 LSB) and the initial command code. In dual mode, the voltage $V_{REFM}$ is charged on the auxiliary capacitance $C_{U1}$ of the upper segment $AR_{UM}$ and on the capacitances of the lower segment $AR_{LP}$ corresponding to the controlled capacitances of the lower segment $AR_{LM}$.

It is evident from the above that a converter as herein described makes it possible to reach all the objects of the invention. It should be observed that the teachings herein can be advantageously combined with the teachings of U.S. Pat. No. 6,600,437. The '437 patent is assigned to the current assignee of the present invention, and is hereby incorporated herein by reference in its entirety. The '437 patent illustrates the possibility of producing the serial capacitance $C_D$ as an integer of elementary units, introducing a fixed capacitance $C_F$ into the lower segment according to the formula:

$$(2^{BL}-1) \cdot C_D - C_F = 2^{BL} \cdot C$$

where BL is the number of encoded bits in the lower segment. For example, in the circuit in FIG. 4, choosing $C_D=2C$ and BL being equal to 3, the result would be $C_F=6C$ (for simplicity, the capacitance $C_F$ is not illustrated in FIG. 4). The capacitance $C_F$ makes it advantageously possible to obtain anchorage of the summing nodes of the lower segments. Therefore, also providing at least one auxiliary conversion element in the upper segment, and by choosing suitable redistribution criteria, an approach is obtained where there is a considerable margin on the dynamic range of the summing nodes. Furthermore, the capacitance $C_F$ could be used directly in the summing operation if it is necessary to sum an analog signal to the input signal.

Naturally, to satisfy contingent and specific requirements, a person skilled in the art may apply to the above-described analog/digital converter to many modifications and variations, all of which however, are included within the scope of protection of the invention as defined by the following claims.

That which is claimed:

1. An analog/digital converter for converting an analog signal to a digital output code comprising:
    a local digital/analog converter comprising an upper segment and a lower segment of conversion elements that can be selectively enabled by respective command codes for respectively varying, according to binary weighted contributions, a voltage of a first common node and a voltage of a second common node, with the upper segment of conversion elements comprising at least one auxiliary conversion element;
    a logic unit to generate digital command codes for controlling said local digital/analog converter according to a successive approximation technique for producing the digital output code; and
    a redistributor to modify the command codes generated by said logic unit for redistributing the command codes between the lower segment and the upper segment while making use of the at least one auxiliary conversion element in the upper segment.

2. An analog/digital converter according to claim 1, wherein the at least one auxiliary conversion element, if enabled, supplies to the first common node an increase in voltage equal to an increases in voltage that can be supplied to the first common node by the conversion elements of the upper segment.

3. An analog/digital converter according to claim 1, wherein the command codes are modified according to redistribution criteria to prevent the voltage of the second common node from reaching a value outside a voltage range.

4. An analog/digital converter according to claim 1, wherein the conversion elements comprise capacitors.

5. An analog/digital converter according to claim 1, wherein the conversion elements comprise resistors.

6. An analog/digital converter according to claim 1, wherein the conversion elements comprise current generators.

7. An analog/digital converter according to claim 1, wherein said redistributor comprises combinatory logic.

8. An analog/digital converter according to claim 7, wherein the conversion elements comprise capacitors; and wherein the redistribution criteria causes said redistributor to perform the following:
    leave unchanged the command code generated by said logic unit if the command code determines, in the lower segment a total switched capacitance less than half of a total capacitance of the lower segment; or otherwise
    redistribute the command code for generating a new command code so as to determine, in the lower segment a total switched capacitance less than half of the total capacitance of the lower segment.

9. An analog/digital converter according to claim 1, wherein the command codes include an initial command code generated by said logic unit for scaling of the analog signal so as to match a dynamic range of the analog signal to a full scale range of the analog/digital converter; and wherein said redistributor modifies the initial command code.

10. An analog/digital converter according to claim 1, wherein said redistributor operates according to redistribution criteria which provides for activation of the at least one auxiliary conversion element and modification of a portion of the command code for controlling the lower segment for safeguarding dynamic range of the second common node.

11. An analog/digital converter according to claim 1, wherein the conversion elements comprise capacitors; and further comprising a capacitance coupled in series between the upper segment and the lower segment, and the lower segment comprising a capacitance such that:

$$(2^{BL}-1) \cdot C_D - C_F = 2^{BL} \cdot C$$

where BL is a number of encoded bits in the lower segment, and C is a unit capacitance value of the lower or upper segment.

12. An analog/digital converter device comprising:
    a digital/analog converter comprising an upper segment and a lower segment of capacitive conversion elements that can be selectively enabled by respectIve command codes for respectively varying a voltage of a first common node and a voltage of a second common node, with the upper segment of capacitive conversion elements comprising at least one auxiliary capacitive conversion element;
    a logic unit to generate digital command codes for controlling said local digital/analog converter for producing a digital output code corresponding to an analog input signal; and
    a redistributor to modify the command codes generated by said logic unit for redistributing the command codes between the lower segment and the upper segment while making use of the at least one auxiliary capacitive conversion element in the upper segment, the command codes being modified according to redistribution criteria to prevent the voltage of the second common node from reaching a value outside a voltage range, the redistribution criteria causes said redistributor to perform the following leave unchanged the command code generated by said logic unit if the command code determines, in the lower segment a total switched capacitance less than half of a total capacitance of the lower segment; or otherwise redistribute the command code for generating a new command code so as to determine, in the lower segment a total switched capacitance less than half of the total capacitance of the lower segment.

13. An analog/digital converter device according to claim 12, wherein said logic unit generates the digital command codes according to a successive approximation technique; and wherein the respective command codes respectively vary the voltage of the first and second common nodes according to binary weighted contributions.

14. An analog/digital converter device according to claim 12, wherein the at least one auxiliary capacitive conversion element, if enabled, supplies to the first common node an increase in voltage equal to an increases in voltage that can be supplied to the first common node by the capacitive conversion elements of the upper segment.

15. An analog/digital converter device according to claim 12, wherein the command codes include an initial command code generated by said logic unit for scaling of the analog signal so as to match a dynamic range of the analog signal to a full scale range of the analog/digital converter; and wherein said redistributor modifies the initial command code.

16. An analog/digital converter device according to claim 12, wherein said redistributor operates according to redistribution criteria which provides for activation of the at least one auxiliary capacitive conversion element and modification of a portion of the command code for controlling the lower segment for safeguarding dynamic range of the second common node.

17. An analog/digital converter device according to claim 12, further comprising a capacitance coupled in series between the upper segment and the lower segment.

18. A method for converting an analog signal to a digital output code comprising:

selectively enabling a digital/analog converter comprising an upper segment and a lower segment of conversion elements by respective command codes for respectively varying, according to binary weighted contributions, a voltage of a first common node and a voltage of a second common node, with the upper segment of conversion elements comprising at least one auxiliary conversion element;

generating digital command codes from a logic unit for controlling the local digital/analog converter according to a successive approximation technique for producing the digital output code; and modifying the command codes generated by the logic unit for redistributing the command codes between the lower segment and the upper segment while making use of the at least one auxiliary conversion element in the upper segment.

19. A method according to claim 18, wherein the at least one auxiliary conversion element, if enabled, supplies to the first common node an increase in voltage equal to an increases in voltage that can be supplied to the first common node by the conversion elements of the upper segment.

20. A method according to claim 18, wherein the command codes are modified according to redistribution criteria to prevent the voltage of the second common node from reaching a value outside a voltage range.

21. A method according to claim 18, wherein the conversion elements comprise at least one of capacitors, resistors and current generators.

22. A method according to claim 21, wherein the conversion elements comprise capacitors; and wherein the redistribution criteria causes the modifying to comprise the following:

leave unchanged the command code generated by the logic unit if the command code determines, in the lower segment a total switched capacitance less than half of a total capacitance of the lower segment; or otherwise redistribute the command code for generating a new command code so as to determine, in the lower segment a total switched capacitance less than half of the total capacitance of the lower segment.

23. A method according to claim 18, wherein the command codes include an initial command code generated by the logic unit for scaling of the analog signal so as to match a dynamic range of the analog signal to a full scale range of the analog/digital converter; and wherein the modifying modifies the initial command code.

24. A method according to claim 18, wherein the modifying modifies according to redistribution criteria which provides for activation of the at least one auxiliary conversion element and modification of a portion of the command code for controlling the lower segment for safeguarding dynamic range of the second common node.

25. A method according to claim 18, wherein the conversion elements comprise capacitors; and further comprising a capacitance coupled in series between the upper segment and the lower segment, and the lower segment comprising a capacitance such that:

$$(2^{BL}-1)\cdot C_D - C_F = 2^{BL}\cdot C$$

where BL is a number of encoded bits in the lower segment, and C is a unit capacitance value of the lower or upper segment.

* * * * *

UNITED STATES PATENT AND TRADEMARK OFFICE
CERTIFICATE OF CORRECTION

PATENT NO. : 7,501,974 B2
APPLICATION NO. : 11/832946
DATED : March 10, 2009
INVENTOR(S) : Confalonieri et al.

It is certified that error appears in the above-identified patent and that said Letters Patent is hereby corrected as shown below:

Column 2, Line 16    Delete: "to the"
                     Insert: --to the one--

Column 7, Line 15    Delete: "embodiment of for"
                     Insert: --embodiment for--

Column 9, Table 1    Delete:

"
| St_cod | | $AR_{LP}$ | | | | | $AR_{LM}$ | | | | |
|---|---|---|---|---|---|---|---|---|---|---|---|
| | | B*[3:0] | | $C_{U1}$ | | $C_{U2}$ | B*[3:0] | | $C_{U1}$ | | $C_{U2}$ |
| 0000 | [0] | 0000 | [0] | 0 | [0] | 0 | [0] | 0000 | [0] | 0 | [0] | 0 | [0] |
| 0001 | [+1] | 0001 | [+1] | 0 | [0] | 0 | [0] | 0000 | [0] | 0 | [0] | 0 | [0] |
| 0010 | [+2] | 0010 | [+2] | 0 | [0] | 0 | [0] | 0000 | [0] | 0 | [0] | 0 | [0] |
| 0011 | [+3] | 0011 | [+3] | 0 | [0] | 0 | [0] | 0000 | [0] | 0 | [0] | 0 | [0] |
| 0100 | [+4] | 0100 | [+4] | 0 | [0] | 0 | [0] | 0000 | [0] | 0 | [0] | 0 | [0] |
| 0101 | [+5] | 0000 | [0] | 1 | [+8] | 0 | [0] | 0011 | [-3] | 0 | [0] | 0 | [0] |
| 0110 | [+6] | 0000 | [0] | 1 | [+8] | 0 | [0] | 0010 | [-2] | 0 | [0] | 0 | [0] |
| 0111 | [+7] | 0000 | [0] | 1 | [+8] | 0 | [0] | 0001 | [-1] | 0 | [0] | 0 | [0] |
| 1000 | [+8] | 0000 | [0] | 1 | [+8] | 0 | [0] | 0000 | [0] | 0 | [0] | 0 | [0] |
| 1001 | [+9] | 0001 | [+1] | 1 | [+8] | 0 | [0] | 0000 | [0] | 0 | [0] | 0 | [0] |
| 1010 | [+10] | 0010 | [+2] | 1 | [+8] | 0 | [0] | 0000 | [0] | 0 | [0] | 0 | [0] |
| 1011 | [+11] | 0011 | [+3] | 1 | [+8] | 0 | [0] | 0000 | [0] | 0 | [0] | 0 | [0] |
| 1100 | [+12] | 0100 | [+4] | 1 | [+8] | 0 | [0] | 0000 | [0] | 0 | [0] | 0 | [0] |
| 1101 | [+13] | 0000 | [0] | 1 | [+8] | 1 | [+8] | 0011 | [-3] | 0 | [0] | 0 | [0] |
| 1110 | [+14] | 0000 | [0] | 1 | [+8] | 1 | [+8] | 0010 | [-2] | 0 | [0] | 0 | [0] |
| 1111 | [+15] | 0000 | [0] | 1 | [+8] | 1 | [+8] | 0011 | [-1] | 0 | [0] | 0 | [0] |
"

Insert:

--
| St_cod | | $AR_{LP}$ | | | | | | $AR_{LM}$ | | | | | |
|---|---|---|---|---|---|---|---|---|---|---|---|---|---|
| | | B*[3:0] | | $C_{U1}$ | | $C_{U2}$ | | B*[3:0] | | $C_{U1}$ | | $C_{U2}$ | |
| 0000 | [0] | 0000 | [0] | 0 | [0] | 0 | [0] | 0000 | [0] | 0 | [0] | 0 | [0] |
| 0001 | [+1] | 0001 | [+1] | 0 | [0] | 0 | [0] | 0000 | [0] | 0 | [0] | 0 | [0] |
| 0010 | [+2] | 0010 | [+2] | 0 | [0] | 0 | [0] | 0000 | [0] | 0 | [0] | 0 | [0] |
| 0011 | [+3] | 0011 | [+3] | 0 | [0] | 0 | [0] | 0000 | [0] | 0 | [0] | 0 | [0] |
| 0100 | [+4] | 0100 | [+4] | 0 | [0] | 0 | [0] | 0000 | [0] | 0 | [0] | 0 | [0] |
| 0101 | [+5] | 0000 | [0] | 1 | [+8] | 0 | [0] | 0011 | [-3] | 0 | [0] | 0 | [0] |
| 0110 | [+6] | 0000 | [0] | 1 | [+8] | 0 | [0] | 0010 | [-2] | 0 | [0] | 0 | [0] |
| 0111 | [+7] | 0000 | [0] | 1 | [+8] | 0 | [0] | 0001 | [-1] | 0 | [0] | 0 | [0] |
| 1000 | [+8] | 0000 | [0] | 1 | [+8] | 0 | [0] | 0000 | [0] | 0 | [0] | 0 | [0] |
| 1001 | [+9] | 0001 | [+1] | 1 | [+8] | 0 | [0] | 0000 | [0] | 0 | [0] | 0 | [0] |
| 1010 | [+10] | 0010 | [+2] | 1 | [+8] | 0 | [0] | 0000 | [0] | 0 | [0] | 0 | [0] |
| 1011 | [+11] | 0011 | [+3] | 1 | [+8] | 0 | [0] | 0000 | [0] | 0 | [0] | 0 | [0] |
| 1100 | [+12] | 0100 | [+4] | 1 | [+8] | 0 | [0] | 0000 | [0] | 0 | [0] | 0 | [0] |
| 1101 | [+13] | 0000 | [0] | 1 | [+8] | 1 | [+8] | 0011 | [-3] | 0 | [0] | 0 | [0] |
| 1110 | [+14] | 0000 | [0] | 1 | [+8] | 1 | [+8] | 0010 | [-2] | 0 | [0] | 0 | [0] |
| 1111 | [+15] | 0000 | [0] | 1 | [+8] | 1 | [+8] | 0001 | [-1] | 0 | [0] | 0 | [0] |
--

UNITED STATES PATENT AND TRADEMARK OFFICE
CERTIFICATE OF CORRECTION

PATENT NO. : 7,501,974 B2
APPLICATION NO. : 11/832946
DATED : March 10, 2009
INVENTOR(S) : Confalonieri et al.

It is certified that error appears in the above-identified patent and that said Letters Patent is hereby corrected as shown below:

Column 12, Claim 2    Delete: "increases"
Line 1                Insert: --increase--

Column 12, Claim 12   Delete: "respectIve"
Line 54               Insert: --respective--

Column 13, Claim 14   Delete: "increases"
Line 27               Insert: --increase--

Column 14, Claim 19   Delete: "increases"
Line 12               Insert: --increase--

Signed and Sealed this

Eighteenth Day of August, 2009

David J. Kappos
*Director of the United States Patent and Trademark Office*